United States Patent [19]

Ekstrom

[11] 3,968,431
[45] July 6, 1976

[54] MEASURING REPETITION RATE
[75] Inventor: Philip A. Ekstrom, Seattle, Wash.
[73] Assignee: Board of Regents, University of Washington, Seattle, Wash.
[22] Filed: May 30, 1974
[21] Appl. No.: 474,829

[52] U.S. Cl. .................... 324/78 E; 128/2.06 F; 324/78 J; 324/99 D; 324/186
[51] Int. Cl.² ............................. G01R 23/02
[58] Field of Search .............. 324/78 R, 78 E, 78 F, 324/78 J, 78 Q, 78 S, 78 Z, 99 D; 328/141; 317/5, 6; 331/44; 332/20; 307/294, 261, 271, 265; 128/DIG. 7, 2.05 T, 2.06 F, 419 P

[56] References Cited
UNITED STATES PATENTS

| | | | |
|---|---|---|---|
| 2,919,401 | 12/1959 | Cole | 324/78 E |
| 3,370,230 | 2/1968 | Mirat et al. | 324/186 |
| 3,436,756 | 4/1969 | Myers et al. | 324/99 D |
| 3,548,807 | 12/1970 | Crovella | 128/2.06 F |
| 3,586,835 | 6/1971 | Foeh | 128/2.06 F |
| 3,675,643 | 7/1972 | Funfstack | 324/78 J |
| 3,729,676 | 4/1973 | Currie | 324/78 E |
| 3,781,677 | 12/1973 | Hagen | 324/78 E |
| 3,857,398 | 12/1974 | Rubin | 128/2.06 F |

OTHER PUBLICATIONS
Caldwell et al., A Wide Range Linear Beat by Beat Cardiotachometer, Med. & Biol. Engng, 1970, vol. 8, pp. 181–185.

Primary Examiner—R. V. Rolinec
Assistant Examiner—Michael J. Tokar
Attorney, Agent, or Firm—Klarquist, Sparkman, Campbell, Leigh, Hall & Whinston

[57] ABSTRACT

Method and apparatus for measuring the repetition rate of a series of electrical input pulses. An electrical quantity having a predetermined initial value changes at a predetermined rate in response to the presence of an input pulse; a later value of the quantity is detected in response to the presence of the next input pulse; and, in response to the later value of the quantity, an electrical output signal is provided that is indicative of the repetition rate of the input pulses. Typically the steps are repeated for a plurality of successive input pulses and a control signal maintains the detected later values of the quantity substantially equal to a predetermined comparison value. An alarm may be provided in response to any substantial change in the repetition rate of the input pulses.

11 Claims, 2 Drawing Figures

3,968,431

MEASURING REPETITION RATE

BACKGROUND

This invention relates to frequency meter circuits for measuring the repetition rate of an input pulse train, or of any repetitive occurrence which can be made to generate a pulse, and is especially suited to measure the rate of the human heartbeat.

The two classes of frequency meter circuits most like the present device might be called "pulse averaging" and the "phase lock" types. The present device might be called a "rate matching" type.

A pulse averaging type of frequency meter generates a standard pulse, one with a fixed voltage and duration, total charge, etc., for each input pulse. The resulting train of standard pulses is then time averaged in amplitude, usually by a low pass electrical filter. The resulting averaged filter output is proportional to the input pulse rate, and is taken as the device output. Wide-range audio range frequency meters are very commonly of this type, as are most heart rate meters.

The phase lock type of frequency meter has an oscillator whose output frequency may be controlled, usually electrically, over the range of pulse input rates expected. A phase comparison circuit generates an output indicating the relative phase difference between the input pulse train and the instrument's internal oscillator. This phase output is applied as negative feedback to control the instrument's oscillator and acts to maintain a constant phase relationship between the input pulse train and the oscillator. This effectively "locks" the oscillator to the frequency of the input train. The oscillator frequency is a known (usually linear) function of the control voltage, so when the oscillator is locked, its control voltage is a measure of the input frequency. The control voltage is taken as the device output. This indirect approach has advantages in some situations and is used as the basis of nearly all deep space communications receivers.

The rate matching frequency meter of the present invention is like the phase lock type in that it is indirect, using negative feedback and taking a control voltage as its output. It is unlike a phase lock in that the controlled factor is a ramp rate, not a frequency, and in that the feedback is generated from ramp overrun. It does not contain an oscillator, while a phase lock type must.

At each input pulse a ramp is started. Here "ramp" means any quantity, such as voltage, charge, etc., which begins at some definite value and changes at some definite rate. When the next input pulse occurs, the value of the quantity at that time is compared with a preset value and the ramp is then restarted. Negative feedback typically is used to control the ramp rate, adjusting it to cause the final value of the quantity to equal the preset value. The control voltage that determines the feedback is taken as the device output, which indicates the pulse repetition rate.

SUMMARY OF THE INVENTON

A typical method according to the present invention for measuring the repetition rate of a series of electrical input pulses comprises the steps of causing an electrical quantity having a predetermined initial value to change at a predetermined rate in response to the presence of an input pulse, detecting a later value of the quantity in response to the presence of the next input pulse, and providing, in response to the later value of the quantity, an electrical output signal indicative of the repetition rate of the input pulses. Typically the steps are repeated for a plurality of successive input pulses and a control signal maintains the detected later values of the quantity substantially equal to a predetermined comparison value. A distinctive output signal may be provided in response to any substantial change in the repetition rate of the input pulses.

Typical apparatus according to the invention for measuring the repetition rate of a series of electrical input pulses comprises (a) means for providing an electrical quantity having a predetermined initial value, (b) means responsive to the presence of an input pulse for changing the value of the quantity at a predetermined rate, (c) means responsive to the presence of the next input pulse for detecting a later value of the quantity, and (d) means responsive to the later value of the quantity for providing an electrical output signal indicative of the repetition rate of the input pulses. The apparatus typically includes (e) means responsive to a plurality of successive detected later values of the quantity for maintaining them substantially equal to a predetermined comparison value. It may also include (f) means for providing a distinctive output signal responsive to any substantial change in the repetition rate of the input pulses, such as means for providing an alarm in response to any substantial excursion of the value of the electrical quantity beyond its previously detected later values.

Typical quantity providing means (a) comprises a first capacitor and means for providing a predetermined initial charge (typically zero) thereon. The value changing means (b) typically comprises means for charging the first capacitor at a substantially constant rate. Typical apparatus includes a second capacitor and means for providing a predetermined charge thereon, and the detecting means (c) comprises (g) means responsive to the difference between the charge on the second capacitor and the charge on the first capacitor. Typical difference responsive means (g) comprises a summing amplifier and a third capacitor connected to transfer the net charge on the first and second capacitors to the third capacitor, and to discharge the first and second capacitors. Typical detected later value maintaining means (e) comprises means responsive to the charge transferred to the third capacitor for controlling the charging rate of the value changing means (b).

Convenient alarm providing means (f) may comprise means responsive to the charge on the first capacitor for providing a signal whenever the charge exceeds a predetermined value.

DESCRIPTION OF PREFERRED EMBODIMENTS

Figure 1:
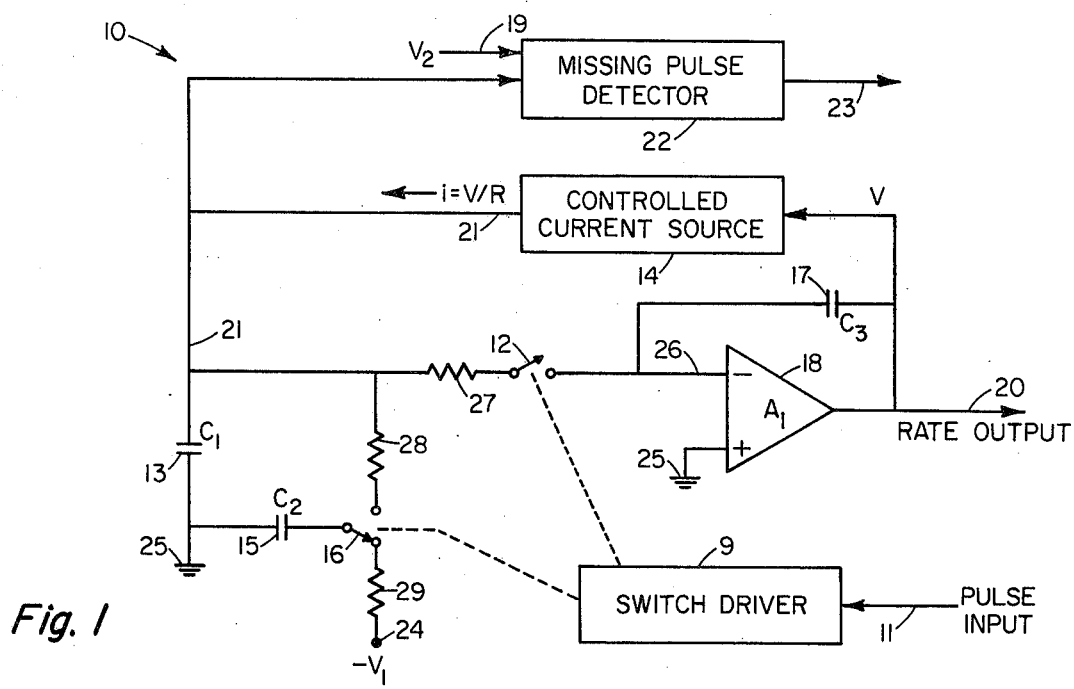
FIG. 1 is a schematic diagram illustrating typical embodiments of the present invention.

FIG. 1 schematically illustrates typical apparatus 10 according to the present invention for measuring the repetition rate of a series of electrical input pulses 11. The apparatus 10 comprises means 9, 12, 13 for providing an electrical quantity at 13 having a predetermined initial value, means 9, 12, 14, 16 responsive to the presence of an input pulse 11 for changing the value of the quantity 13 at a predetermined rate, means 9, 15–18, responsive to the presence of the next input pulse 11 for detecting a later value of the quantity 13, and means 18 responsive to the later value of the quantity for providing an electrical output signal 20 indicative of the repetition rate of the input pulses 11. The apparatus 10 typically includes means 14, 21 responsive to a plurality of successive detected later values of the quantity 13 for maintaining them substantially equal to a predetermined comparison value (at 16). It may also include means 22 for providing a distinctive output signal 23 responsive to any substantial change in the repetition rate of the input pulses 11, such as a missing pulse detector means 22 for providing an alarm output at 23 in response to any substantial excursion of the value of the electrical quantity 13 beyond its previously detected later values.

Typical quantity providing means 9, 12, 13 comprises a first capacitor 13 and switching means 12 for providing a predetermined initial charge thereon (typically a charge of zero by shorting the capacitor 13 (at 26) virtually to the ground 25). The value changing means 9, 12, 14, 21 typically comprises means 14, 21 for charging the first capacitor 13 at a substantially constant rate. Typical apparatus 10 includes a second capacitor 15 and means including a switch 16 and a source of potential at 24 for providing a predetermined charge thereon, and the detecting means 9, 15–18 comprises means 17, 18 responsive to the difference between the charge on the second capacitor 15 and the charge on the first capacitor 13. Typical difference responsive means 17, 18 comprises a summing amplifier 18 and a third capacitor 17 connected by the switch 12 to transfer the net charge (at 21) on the first and second capacitors 13, 15 to the third capacitor 17, and to discharge the first and second capacitors 13, 15 virtually to the ground 25 through the low impedance at 26 formed by the action of the amplifier 18 and the capacitor 17. Typical detected later value maintaining means 14 comprises means such as a controlled current source 14 responsive to the charge transferred to the third capacitor 17 for controlling the charging rate of the value changing means 9, 12, 14, 21.

Convenient alarm providng means 22 may comprise means such as the missing pulse detector 22 responsive to the charge on the first capacitor 13 for providing a signal 23 whenever the charge 13 exceeds a predetermined value.

A typical method of using apparatus 10 as in FIG. 1 for measuring the repetition rate of a series of electrical input pulses 11 comprises the steps of causing an electrical quantity at 13 having a predetermined initial value to change at a predetermined rate in response to the presence of an input pulse 11, detecting a later value of the quantity at 13 in response to the presence of the next input pulse 11, and providing, in response to the later value of the quantity, an electrical output signal 20 indicative of the repetition rate of the input pulses 11. Typically the steps are repeated for a plurality of successive input pulses 11 and a control signal (via 17, 14, 21) maintains the detected later values of the quantity 13 substantially equal to a predetermined comparison value at 16. A distinctive output signal 23 may be provided by the missing pulse detector 22 in response to any substantial change in the repetition rate of the input pulses 11.

The rate matching frequency meter 10 of the present invention is like the phase lock type in that it is indirect, using negative feedback as at 21 (via 17, 14) and taking a control voltage (via 18) as its output 20. It is unlike a phase lock in that the controlled factor is a ramp rate, not a frequency, and in that the feedback is generated from ramp overrun. It does not contain an oscillator, while a phase lock type must.

At each input pulse ($t = 0$) a ramp is started. Here "ramp" means any quantity, such as voltage, charge, etc., which begins at some definite value and changes at some definite rate. Let us denote the changing quantity as $q$, the starting value $q_0$, the rate of change $K$, and time as $t$. The value of q is therefore given by:

$$q = q_0 + Kt$$

When the next input pulse occurs, the value of $q$ at that instant is compared with a preset value $q_1$ and the ramp is restarted at $q_0$. If the interval between pulses is $t_1$, then the difference is:

$$\Delta q = q_1 - q = q_1 - q_0 - Kt_1$$

Negative feedback is used controlling $K$ to bring $\Delta q$ to zero. When $\Delta q$ is zero:

$$q_1 - q_0 - Kt_1 = 0 \text{ and } K = \frac{q_1 - q_0}{t_1}$$

But the pulse frequency $f$ is just $1/t_1$, so the rate $K = f(q_1 - q_0)$ is proportional to the input frequency $f$. The control voltage which determines $K$ is taken as the device output.

Since the negative feedback is necessarily of a discontinous type, with correction information available only when input pulses occur, let us consider a possible feedback arrangement and examine its stability limits and transient response. Let $K$ be corrected by an amount $\Delta K$ proportional to $\Delta q$ whenever an input pulse occurs. Take $$\Delta K = L\Delta q = L(q_1 - q_0 - Kt) = Lt_1 \left[\frac{q_1 - q_0}{t_1} - K\right]$$

Define the first term in the bracket as $$K_0 \equiv \frac{q_1 - q_0}{t_1} = (q_1 - q_0)f, \quad \Delta K = Lt_1 [K_0 - K]$$

This is a linear recurrence relation in $K$. When it is studied either analytically or by simulations, the following results are found: as it is repeatedly applied, corresponding to circuit action as pulses occur, $K$ tends toward $K_0$ as long as $Lt_1 < 2$. It tends monitonically toward $K_0$ when $Lt_1 \le 1$, i.e., $L \le f$. Under either of these two conditions, the circuit balances itself up after any disturbance, and will therefore adjust to changes in input rate.

It is also found that the response time of the circuit, the time required for any difference between $K$ and $K_0$ to 95% disappear, is less than $3/L$ seconds for $f \ge L$.

After the circuit has adjusted itself so that $K = K_0$, we have $$K = K_0 = f(q_1 - q_0)$$

just as is obtained from the less detailed analysis above.

One can show that when $f \ge L$, the ripple in $K$ is always less than $K-K_0$ and for steady inputs is, therefore, zero. This is a major advantage of the rate matching meter in contrast with the more common pulse averaging type of circuit where some output ripple persists at all times, usually larger in amplitude for small $f$, and where an attempt to reduce it usually lengthens response time.

The circuit has two difficulties associated with low input pulse rates. The first is instability which occurs for $f \leq L/2$. The second is the fact that its output changes only when an input pulse occurs. In many applications a certain minimum rate can be assumed, and L can be chosen for stability at this rate. Heart rate monitoring is such an application, except that complete cessation of input is an important possibility which must be detected. When an interval between pulses is unusually long, the ramp goes abnormally far past $q_1$. This can be detected by monitoring $q$. In particular, in the case where $K \approx K_o$ and $n$ pulses are missed from a train of frequency $f$, $t = n/f$, and $q = q_o + Kt \approx q_o + K_o n/f$, so $q \approx q_o + n(q_1 - q_o)$.

In any practical realization of the circuit, many of the simplifying assumptions may not be met. For example, if the comparison between $q$ and $q_1$ is not instantaneous but takes a time $t'$ after which the ramp is restarted, then $f = 1/(t_1 + t')$. As long as $t'$ is much smaller than $t_1$ the linearity of the device will not be appreciably affected. Similarly, a practical scheme for correcting $K$ may introduce a small amount of ripple even when $K = K_o$. The analysis given here is intended as a simplified presentation and as an ideal to be approached by the application of good engineering practice.

FIG. 1 shows a rate matching frequency meter 10 in which the ramp quantity is the charge on the first capacitor 13, $C_1$. The ramp rate $K$ is equal to the current $i$, which is proportional to the output voltage $V$ (at 20). The relation is $K = i = V/R$, where $R$ is a property of the controlled current source 14. The comparison quantity $-q_1$ is the charge which the second capacitor 15, $C_2$ receives when connected at 24 (by the switch 16) to the voltage $-V_1$. $-q_1 = C_2(-V_1)$. Operation is as follows.

The ramp is started with the first capacitor 13 discharged, so $q_o = 0$. During the interval until the next input pulse 11, charge steadily accumulates in the capacitor 13, and the second capacitor 15 charges quickly to a voltage $-V_1$. When a pulse 11 occurs, the switch 16 is first operated to disconnect the second capacitor 15 from $-V_1$ and connect it to the first capacitor 13. Voltages across the two capacitors 13, 15 equalize, and their charges add algebraically with a net charge remaining of $q - q_1$. The switch 12 is then operated to connect both capacitors 13, 15 to the summing junction 26 of an integrator made up of the d-c amplifier 18 (A1) and the third capacitor 17. The "virtual ground" appearing at the integrator input 26 discharges both the first and second capacitors 13, 15 and dumps their charge into the third capacitor 17, causing a change in $V$ of $\Delta V = (q_1 - q)/C_3$. Both switches 12, 16 are returned to their original positions as in FIG. 1, and the first capacitor 13, now discharged, begins to charge again. The resistors 27, 28, 29 represent the unavoidable resistances of the various charging circuits. In practice the whole switching cycle must occupy a time much shorter than $t_1$, so electronic switches 12, 16 usually are employed.

To make connections with the previous analysis, note that:

$$\Delta K = \Delta i = \Delta V/R = \frac{q_1 - q}{RC_3} ; \quad \Delta K = \frac{t(K_o - K)}{RC_3}$$

where $$K_o = q_1/t_1 = fC_2V_1$$

We can readily identify $L = 1/RC_3$. But $K = V/R$, so when $K = K_o$, $V = fRC_2V_1$ and the device is a frequency meter with a response time of $\leq 3/L = 3RC_3$.

Another portion of the circuit 10 monitors the voltage at 21 appearing across the first capacitor 13 ($C_1$), comparing it with some value $V_2$ (at 19). The voltage across $C_1$ is $q/C_1 = (q_o + Kt)/C_1$. Now if $K \approx K_o$, and since $q_o = 0$, this is approximately $fC_2V_1t/C_1$, so for $n$ skipped pulses, $t = n/f$, the voltage reaches $n C_2 V_1/C_1$. $V_2$ may be set so as to sound an alarm when $n$ exceeds some selected number.

Figure 2:
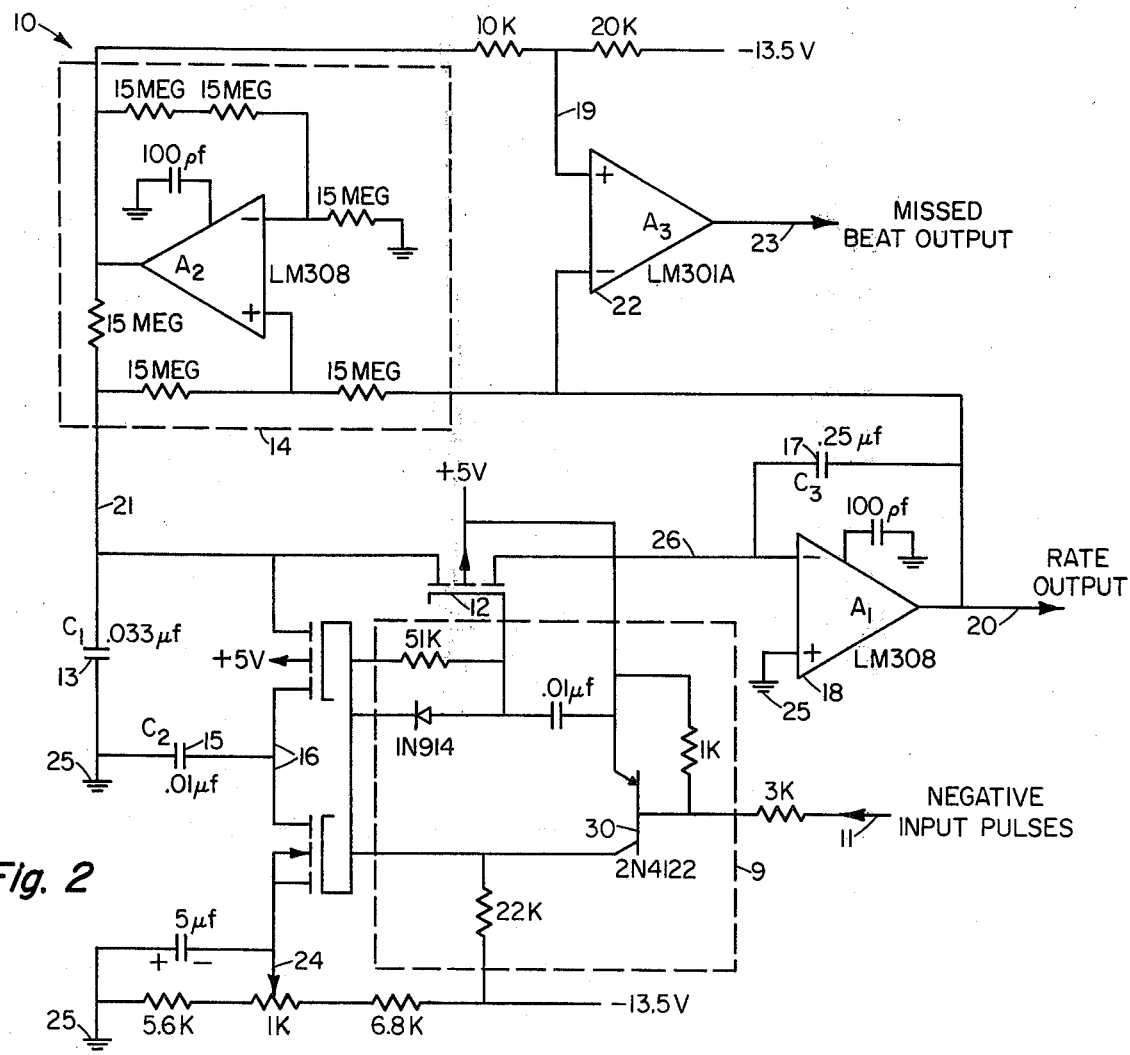
FIG. 2 is a schematic diagram showing in more detail a typical preferred embodiment of the invention.

FIG. 2 is a more detailed schematic diagram of a rate matching frequency meter 10 employing these concepts. Its main features may be identified with reference to FIG. 1. The current source 14 is made from the d-c amplifier $A_2$ and the bridge of 15 megohm resistors in a standard circuit configuration. R is 10 megohms. The switches are made from three of the six field effect transistors packaged together as Radio Corporation of America part Number CD4007D. $V_1$ is set by the resistive divider including the one kilohm calibration control at 24. The comparison necessary for missed beat alarm is carried out by the d-c amplifier 22 ($A_3$). It examines the outputs of the amplifiers $A_1$ and $A_2$ to deduce the voltage across the first capacitor 13, thereby making an equivalent comparison without loading the very high impedance point at 21. Negative input pulses 11, standardized to about 1 millisecond length, are applied to the base of the transistor 30 via a 3 kilohm resistor. Comparator output at 23 will rise when an interval of 2.5 /$f$ (i.e., $n = 2.5$) passes without an input pulse 11. This output 23 may be used in any desired manner to indicate an interruption of the input pulse train 11. The circuit is stable down to 12 pulses per minute with the values given, and has monotonic convergence toward a new output value above 24 pulses per minute. Its performance is satisfactory to above 240 pulses per minute. The d-c amplifiers LM301A and LM308 are manufactured by National Semiconductor Corporation. In the rate output at 20, 1 volt corresponds to approximately 100 pulses per minute.

While the forms of the invention herein disclosed constitute presently preferred embodiments, many others are possible. It is not intended herein to mention all of the possible equivalent forms or ramifications of the invention. It is to be understood that the terms used herein are merely descriptive rather than limiting, and that various changes may be made without departing from the spirit or scope of the invention.

I claim:

1. Apparatus for measuring the repetition rate of a series of electrical input pulses, comprising:
    reference means for providing a first electrical reference quantity of predetermined value;
    ramp generator means for generating ramp signals in response to the receipt of said input pulses, each of said ramp signals being initiated by the receipt of one input pulse and terminated at a peak value of the ramp signal in response to the receipt of the next input pulse, said ramp signal increasing in amplitude from a predetermined initial value to said maximum value at a ramp rate;

comparator means for comparing said ramp signal with said reference value to provide a control signal output proportional to the difference between said peak ramp value and said reference value; and negative feedback means connected from the output of said comparator means to said ramp generator means, for changing said ramp rate in accordance with the value of said control signal to reduce said difference to zero and thereby cause said control signal to be proportional to the repetition rate of said input pulse.

2. Apparatus in accordance with claim 1 which also includes detector means for comparing a signal proportional to the ramp rate with a second electrical reference quantity of predetermined value to provide an alarm signal output when said ramp rate exceeds a predetermined rate.

3. Apparatus in accordance with claim 1 in which the ramp generator means includes a first capacitor, and the reference means includes a second capacitor which is connected through a first switch means to said first capacitor when said first switch means is actuated in response to the receipt of an input pulse, said first and second capacitors having a common connection terminal connected through a second switch means also actuated by said input pulse to the input of a phase inverter amplifier having a third capacitor connected between the input and the output of said amplifier to provide the comparator means.

4. Apparatus as in claim 1 wherein the feedback means comprises switch means for intermittently opening and closing the feedback loop in response to the receipt of input pulses.

5. Apparatus as in claim 1 wherein the reference means comprises a first capacitor and means for providing a predetermined initial charge thereon.

6. Apparatus as in claim 5, wherein the initial charge is zero.

7. Apparatus as in claim 6, wherein the ramp generator means comprises means for charging the first capacitor at a substantially constant rate.

8. Apparatus as in claim 7, including a second capacitor and means for providing a predetermined charge thereon, and wherein the comparator means comprises means responsive to the difference between the charge on the second capacitor and the charge on the first capacitor.

9. Apparatus as in claim 8, wherein the comparator means comprises a summing amplifier and a third capacitor connected to transfer the net charge on the first and second capacitors to the third capacitor, and to discharge the first and second capacitors.

10. Apparatus as in claim 9, including a current source responsive to the charge transferred to the third capacitor, for controlling the charging rate of the first capacitor.

11. Apparatus as in claim 5, including alarm providing means responsive to the charge on the first capacitor for providing a signal whenever the charge exceeds a predetermined value.

* * * * *